(12) United States Patent
Shin et al.

(10) Patent No.: US 8,241,712 B2
(45) Date of Patent: Aug. 14, 2012

(54) METHOD FOR FABRICATING FINE CONDUCTIVE PATTERNS USING SURFACE MODIFIED MASK TEMPLATE

(75) Inventors: Dong-Youn Shin, Daejeon (KR); Taik-Min Lee, Daejeon (KR)

(73) Assignee: Korea Institute of Machinery and Materials, Daejeon (KR)

( * ) Notice: Subject to any disclaimer, the term of this patent is extended or adjusted under 35 U.S.C. 154(b) by 390 days.

(21) Appl. No.: 12/616,853

(22) Filed: Nov. 12, 2009

(65) Prior Publication Data

US 2011/0097514 A1    Apr. 28, 2011

(30) Foreign Application Priority Data

Oct. 23, 2009 (KR) .................. 10-2009-0101310

(51) Int. Cl.
*B05D 3/00* (2006.01)
*C08J 7/18* (2006.01)
*G21H 5/00* (2006.01)

(52) U.S. Cl. ....... 427/555; 427/559; 427/98.4; 427/259; 427/272

(58) Field of Classification Search .................. None
See application file for complete search history.

(56) References Cited

U.S. PATENT DOCUMENTS

| 4,344,817 | A | | 8/1982 | Chamberlin |
| 5,860,843 | A | * | 1/1999 | Kasahara ............... 445/24 |
| 6,036,889 | A | * | 3/2000 | Kydd ................... 252/512 |
| 6,705,910 | B2 | | 3/2004 | Sheu et al. |
| 2002/0031616 | A1 | * | 3/2002 | Neoh et al. ............ 427/553 |
| 2004/0203235 | A1 | | 10/2004 | Miyakawa |
| 2005/0250244 | A1 | | 11/2005 | Li et al. |
| 2006/0223221 | A1 | * | 10/2006 | Ishii ..................... 438/99 |
| 2006/0281333 | A1 | * | 12/2006 | Shin et al. ............. 438/780 |
| 2008/0223237 | A1 | * | 9/2008 | Ando et al. ............ 101/333 |
| 2008/0233493 | A1 | * | 9/2008 | Ishizeki et al. ......... 430/7 |
| 2010/0323122 | A1 | | 12/2010 | Shin et al. |

FOREIGN PATENT DOCUMENTS

KR         100691706 B1    5/2006
(Continued)

OTHER PUBLICATIONS

Lim et al., Surface Treatment and Characterization of PMMA, PHEMA, and PHPMA, J. Vac. Sci. Technol. A 19(4), Jul./Aug. 2001, pp. 1490-1496.*

(Continued)

*Primary Examiner* — Timothy Meeks
*Assistant Examiner* — Michael P Rodriguez
(74) *Attorney, Agent, or Firm* — Dority & Manning, P.A.

(57) ABSTRACT

Disclosed is a method for fabricating fine conductive patterns using a surface modified mask template, the method including: depositing a high molecular substance on a substrate; applying a hydrophobic material onto the high molecular substance so that the hydrophobic material can infiltrate into the high molecular substance; forming a mask template by removing a part of the high molecular substance to form a recess where a region of the substrate is exposed to an outside; depositing conductive ink on the mask template; and performing annealing to abstract metal particles from a metallic compound dissolved in the conductive ink so that an insulating pattern can be formed in a region on which the high molecular substance is deposited, but a conductive pattern can be formed as the metal particles are abstracted from the conductive ink in the recess and cohere with each other.

8 Claims, 6 Drawing Sheets

FOREIGN PATENT DOCUMENTS

KR          100969172 B1     7/2010

OTHER PUBLICATIONS

Lodha et al., Effect of Annealing on Electrical Conductivity and Morphology of Polyanilne Films, Journal of Applied Polymer Science, 2001, vol. 82, pp. 3602-3610.*

Kobayashi et al., Electrical Conductivity of Annealed Polyaniline, Journal of Applied Physics, 1993, 74: 296-299.*

V. Tsakova, How to Affect Number, Size, and Location of Metal Particles Deposited in Conducting Polymer Layers, J. Solid State Electrochem, 2008, 12:1421-1434.*

Kobayashi et al., Electrical Conductivity of Annealed Polyaniline, Journal of Applied Physics, 1993, 74:296-299.*

* cited by examiner (a)

(b)

METHOD FOR FABRICATING FINE CONDUCTIVE PATTERNS USING SURFACE MODIFIED MASK TEMPLATE

CROSS-REFERENCE TO RELATED APPLICATION

This application claims the benefit of Korean Patent Application No. 10-2009-0101310, filed Oct. 23, 2009, the disclosure of which is hereby incorporated herein by reference in its entirety.

BACKGROUND OF THE INVENTION

1. Field of the Invention

The present invention relates to a method for fabricating fine conductive patterns using a surface modified mask template, and more particularly to a method for fabricating fine conductive patterns using a surface modified mask template, in which the fine conductive patterns can be fabricated without a short-circuit due to an overlap error between patterns in the case of using direct printing such as inkjet printing.

2. Description of the Related Art

In the electronic and display fields, efforts have been continued to fabricate an element through a printing process so as to reduce process and material costs and to facilitate mass production, and researches have also been pursued on such a field of direct printing in the academic world.

For example, there have been actively carried out researches on employing roll or inkjet printing for fabricating an electronic element such as an organic thin film transistor, a humidity sensor, and a radio frequency (RF) filter based on low temperature co-fired ceramic technology.

However, the inkjet printing using liquid ink is inadequate to fabricate fine patterns having a size from several to several tens of micrometers since wetting of a printer nozzle causes change in droplet ejection conditions, ejecting directions, etc. Particularly, in the case of a thin film transistor that requires fine overlap between patterns, a problem may arise in that a short-circuit or the like takes place due to an overlap error so that an element cannot operate.

To solve this problem, the present applicant has proposed a method for to fabricating fine conductive patterns using a mask template in Korean Patent Application No. 10-2009-0055437. Referring to FIG. 1, in a conventional application, conductive ink 50 is not sufficiently deposited on a high molecular substance 20 and a substrate 10 because the high molecular substance 20 for fabricating a mask template 40 has no hydrophobicity.

Further, the conductive ink 50 deposited on the substrate 10 infiltrates into a gap between particles of the high molecular substance 20 when annealed and transformed into conductive particles, thereby causing lack of the conductive particles in a recess 42. As the amount of conductive ink 50 to form a conductive pattern 61 in the recess 42 decreases, the conductive pattern 61 may have high resistance and non-uniform thickness.

SUMMARY OF THE INVENTION

Accordingly, an aspect of the present invention is to provide a method for fabricating fine conductive patterns using a surface modified mask template, in which a surface of particles constituting a high molecular substance is modified by applying a hydrophobic material on to the high molecular substance that will have insulating properties finally in the mask template, so that conductive ink can be sufficiently deposited in a recess and it can be controlled that the conductive ink infiltrates into a gap between the particles of the high molecular substance, thereby maintaining a constant amount of the conductive ink that will form the conductive pattern uniform in the recess.

Additional aspects and advantages of the present invention will be set forth in part in the description which follows and, in part, will be obvious from the description, or may be learned by practice of the invention based on means from and combination of claims.

The foregoing and/or other aspects of the present invention may be achieved by providing a method for fabricating fine conductive patterns using a surface modified mask template, the method including: depositing a high molecular substance on a substrate; applying a hydrophobic material onto the high molecular substance so that the hydrophobic material can infiltrate into the high molecular substance; forming a mask template by removing a part of the high molecular substance to form a recess where a region of the substrate is exposed to an outside; depositing conductive ink on the mask template; and performing annealing to abstract metal particles from a metallic compound dissolved in the conductive ink so that an insulating pattern can be formed in a region on which the high molecular substance is deposited, but a conductive pattern can be formed as the metal particles are abstracted from the conductive ink in the recess and cohere with each other.

The conductive ink deposited on the high molecular substance may be infiltrated into gaps of the high molecular substance, and the metal particles abstracted from the conductive ink by the annealing may be spaced apart and generally and electrically insulated from each other in the high molecular substance to form the insulating pattern.

The depositing the conductive ink may include using inkjet printing to deposit the conductive ink.

The forming the mask template may include irradiating a laser beam to the high molecular substance to remove the part of the high molecular substance.

The forming the mask template may include using an imprinting method.

The performing the annealing may include heating the conductive ink at a temperature ranging from 150° C. to 350° C.

The high molecular substance may include polyaniline.

The conductive ink may include an organic metal compound in the form of a solution.

The conductive ink may further include metal particles.

According to an exemplary embodiment of the present invention, there is provided a method for fabricating fine conductive patterns using a surface modified mask template, in which a hydrophobic material is applied onto a high molecular substance that will form a mask template, so that conductive ink to be formed on a substrate and become the conductive pattern can be sufficiently formed in a recess and it can be controlled that the conductive ink infiltrates into the high molecular substance, thereby maintaining a constant amount of the conductive ink that will form the conductive pattern uniform, decreasing the resistance of the conductive pattern, and keeping the thickness of the pattern uniform.

Further, according to an exemplary embodiment of the present invention, there is provided a method for fabricating fine conductive patterns using a surface modified mask template, in which conductive ink is applied to a mask template, so that the conductive ink formed on a high molecular substance can react with the high molecular substance and form an insulating pattern, but the conductive ink formed in a recess can form the conductive pattern, thereby guaranteeing insulation between the conductive patterns even though the conductive ink is improperly applied, and reducing defective proportion on processes.

BRIEF DESCRIPTION OF THE DRAWINGS

These and/or other aspects and advantages of the present invention will become apparent and more readily appreciated from the following description of the embodiments, taken in conjunction with the accompanying drawings of which.

DETAILED DESCRIPTION OF THE INVENTION

Below, a method of fabricating fine conductive patterns using a surface modified mask template according to an exemplary embodiment of the present invention will be described with reference to accompanying drawings.

Figure 1:
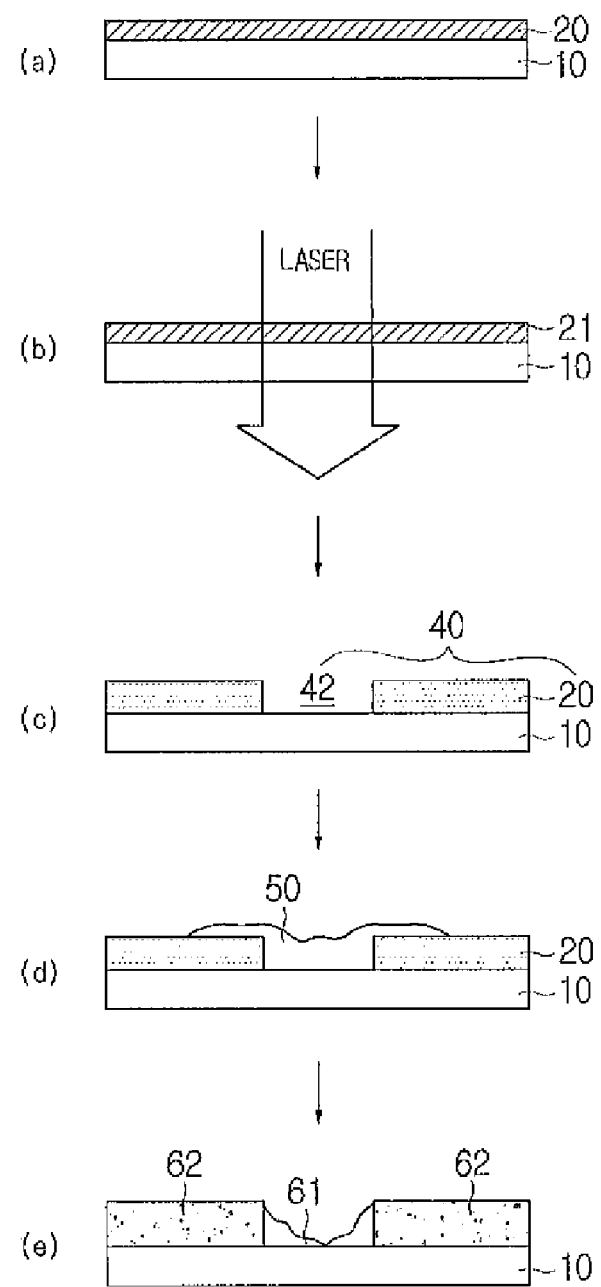
FIG. 1 sequentially shows a method of fabricating fine conductive patterns using a mask template formed by a high molecular substance, the surface of which is not modified by a hydrophobic material.
Figure 2:
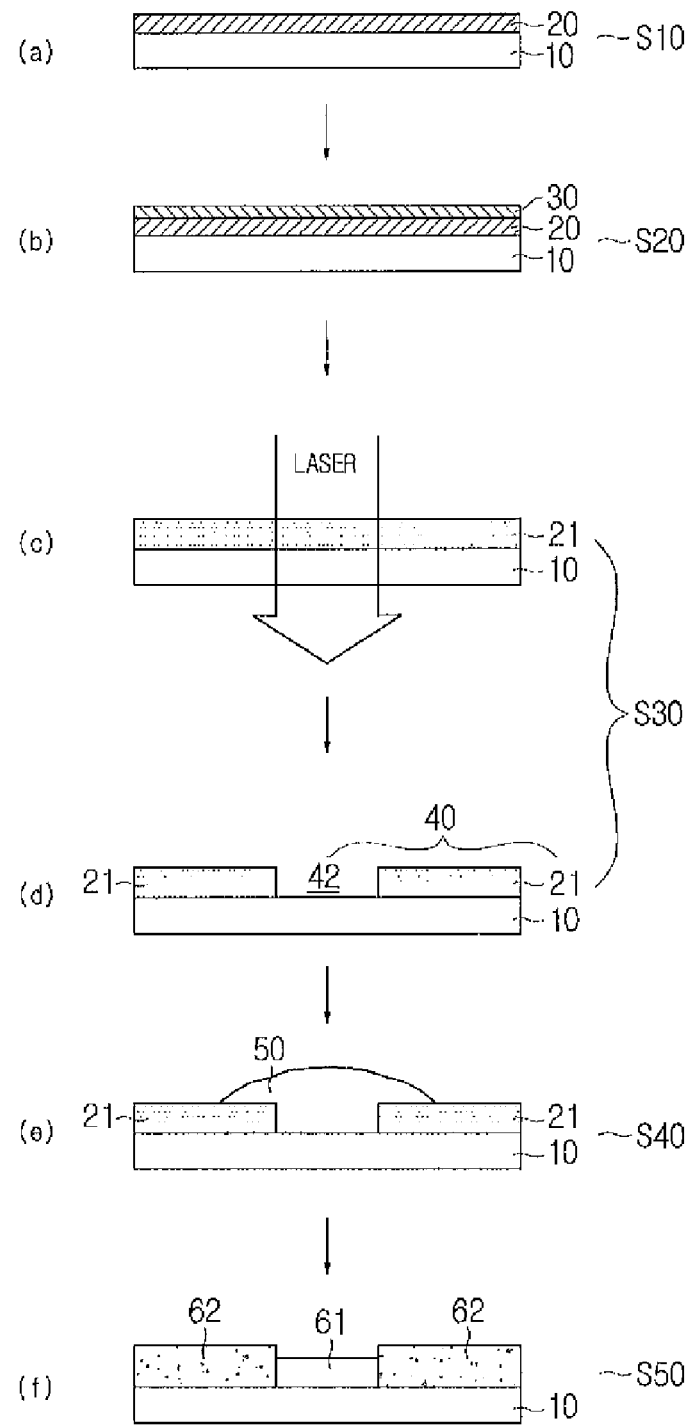
FIG. 2 sequentially shows a method of fabricating fine conductive patterns using a mask template formed by a high molecular substance, the surface of which is modified by a hydrophobic material.
Figure 3:
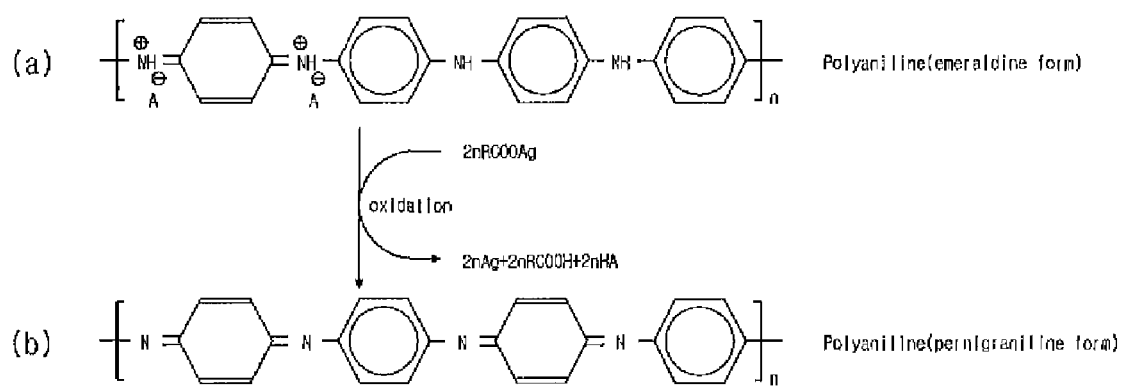
FIG. 3 is a chemical formula showing that emeraldine base polyaniline is oxidized into pernigraniline base polyaniline.
Figure 4:
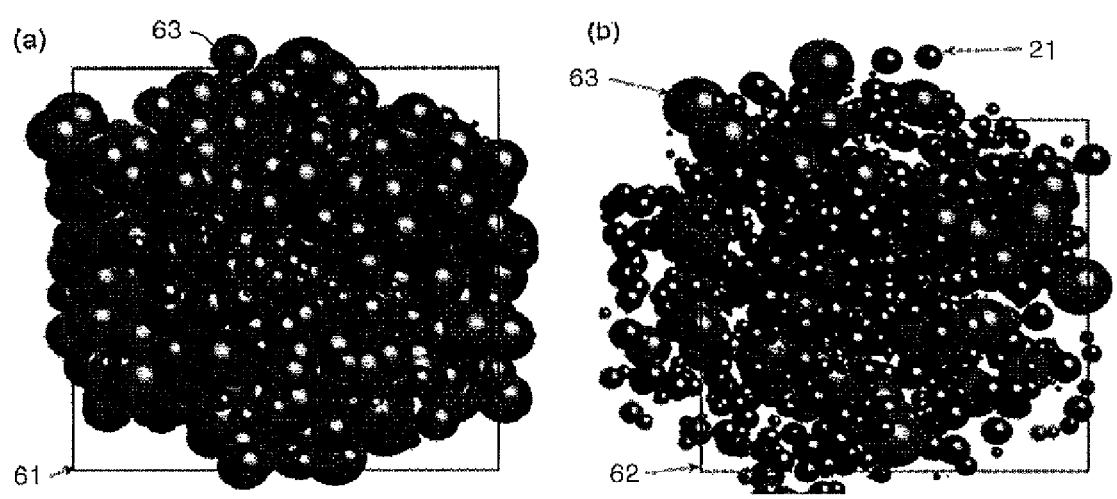
FIG. 4 shows a conductive pattern and an insulating pattern formed depending on whether there exists the high molecular substance when metal particles (nano-cluster) are abstracted from an organic metallic compound dissolved in the conductive ink of FIG. 2.
Figure 5:
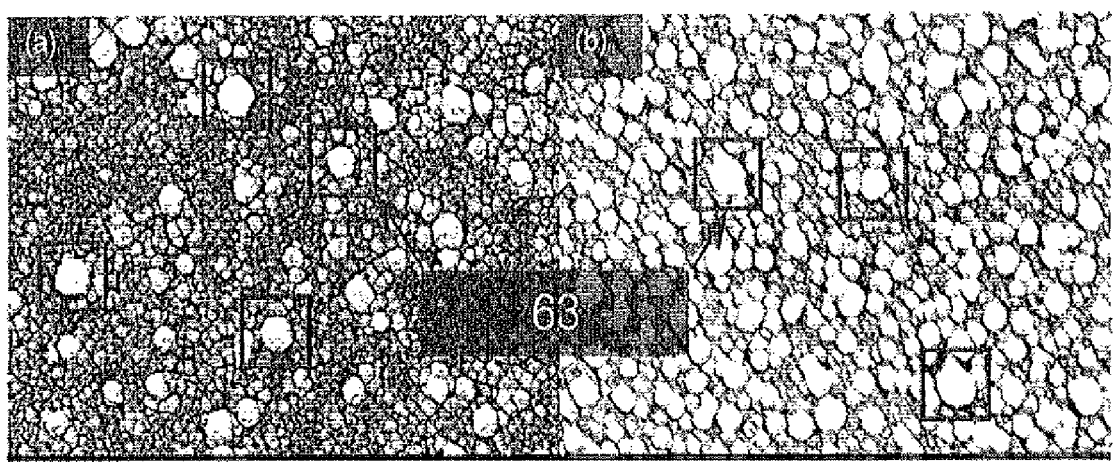
FIG. 5 shows that the metal particles (nano-cluster) abstracted from the conductive ink after annealing of FIG. 2 are arranged within the high molecular substance as being spaced apart from each other.
Figure 6:
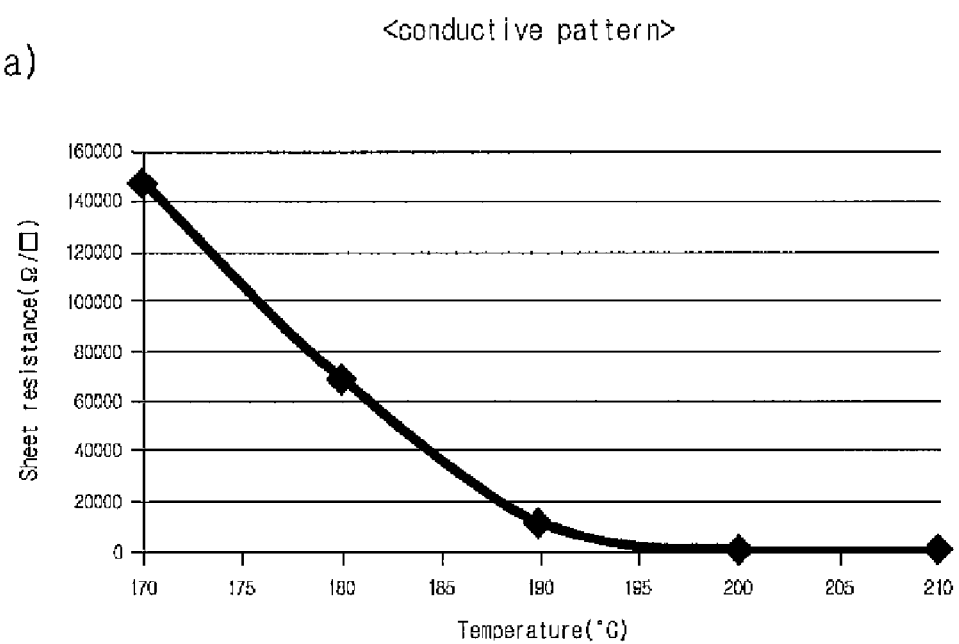
FIG. 6 is a graph showing sheet resistance (a) of the conductive pattern and sheet resistance (b) of the insulating pattern measured after the annealing of FIG. 2.
Figure 6:
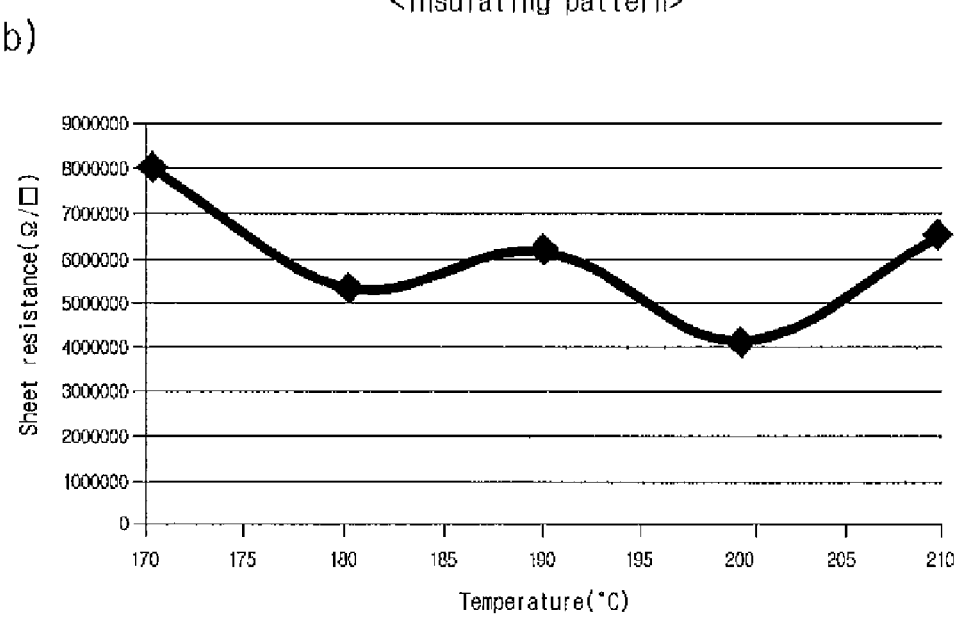

FIG. 2 sequentially shows a method of fabricating fine conductive patterns using a mask template formed by a high molecular substance, the surface of which is modified by a hydrophobic material, FIG. 3 is a chemical formula showing that emeraldine base polyaniline is oxidized into pernigraniline base polyaniline, FIG. 4 shows a conductive pattern and an insulating pattern formed depending on whether there exists the high molecular substance when metal particles (nano-cluster) are abstracted from an organic metallic compound dissolved in the conductive ink of FIG. 2, FIG. 5 shows that the metal particles (nano-cluster) abstracted from the conductive ink after annealing of FIG. 2 are arranged within the high molecular substance as being spaced apart from each other, and FIG. 6 is a graph showing sheet resistance (a) of the conductive pattern and sheet resistance (b) of the insulating pattern measured after the annealing of FIG. 2.

Referring to FIGS. 2 to 6, a method of fabricating fine conductive patterns using a surface modified mask template according to an exemplary embodiment of the present invention includes a step S10 of depositing a high molecular to substance, a step S20 of applying a hydrophobic material, a step S30 of forming a mask template, a step S40 of depositing ink, and a step S50 of annealing.

In the step S10 of depositing the high molecular substance, the high molecular substance 20 is deposited on a substrate 10. Here, the high molecular substance 20 may be deposited by a coating method such as slit-coating or spin-coating using centrifugal force for applying the material, or may be coated by a printing method such as a roll coater, screen printing, etc. In this embodiment, a spin-coater is set to have a rotation number of 500 rpm, and the high molecular substance 20 is applied onto the substrate 10 for 20 seconds. Alternatively, the high molecular substance 20 may be deposited by a spray coating method.

In this embodiment, the high molecular substance 20 to be deposited on the substrate 10 includes polyaniline that is easily produced and excellent in thermal properties as compared with other high molecular substances. Here, polyaniline may be deposited on the substrate 10 in the form of leuco-emeraldine base, emeraldine base, or pernigraniline base.

The emeraldine base polyaniline is produced by partially oxidizing leuco-emeraldine base polyaniline, and is conductive and greenish. Thus, if the emeraldine base polyaniline is deposited on the substrate 10, the substrate 10 becomes greenish.

After depositing polyaniline on the substrate 10, it is heated at a temperature of 170° C. for five minutes, thereby removing remaining organic solvents from polyaniline and at the same time increasing resistance of polyaniline to the organic solvents.

In the step S20 of applying the hydrophobic material, the hydrophobic material 30 is applied onto the high molecular substance 20. Like the deposition of the high molecular substance 20, the hydrophobic material may be applied by the coating method such as the slit-coating or the spin-coating using centrifugal force for applying the material, or by the printing method such as the roll coater, the screen printing, etc. In this embodiment, the spin-coater is set to have a rotation number of 500 rpm, and the hydrophobic material is applied onto the high molecular substance 20 for 20 seconds. Alternatively, the hydrophobic material 30 may be deposited by the spray coating method.

In this embodiment, a hydrocarbon group containing fluorine may be widely used as the hydrophobic material 30 to be applied onto the high molecular substance 20. For example, 3M SRC-220, Cytonix FluoroPel or the like compound such as may be used as the hydrophobic material 30.

After applying the hydrophobic material 30 on to the high molecular substance 20, the hydrophobic material 30 infiltrates into the high molecular substance 20. In this embodiment, the hydrophobic material 30 is not coated as one layer on the high molecular substance 20, but infiltrated into everywhere of the high molecular substance 20, thereby transforming the high molecular substance 20 to have hydrophobicity throughout. Here, the high molecular substance transformed to have hydrophobicity is given a reference numeral of "21."

After polyaniline is deposited on the substrate and the hydrophobic material 30 is applied thereto, in the step S30 of forming a mask template, a laser beam having a wavelength of 532 nm is irradiated on deposited polyaniline, thereby partially removing polyaniline. When polyaniline is removed, the mask template 40 is formed. The mask template 40 includes a recess 42 which exposes a partial region of the substrate 10 to the outside, and the hydrophobic high molecular substance 21 which covers the other regions of the substrate 10. Here, the laser beam is not limited to a certain wavelength as long as it can easily remove the high molecular substance 21 without damaging the substrate 10.

In the step S40 of depositing ink, the conductive ink 50 is applied on to the mask template 40. In this embodiment, inkjet printing is employed for depositing the conductive ink 50 on the mask template 40. Ideally, a nozzle (not shown) for ejecting the conductive ink 50 has to be aligned with a path of the recess 42 and to apply the conductive ink 50 to only a region of the substrate 10 on the bottom of the recess 42. However, the conductive ink 50 is generally applied not only onto the region of the substrate 10 on the bottom of the recess 42 but also onto the high molecular substance 21 due to an error in a driving unit for driving the nozzle, change in droplet ejection conditions, or the like factors.

The deposited conductive ink 50 in this embodiment may include an organometallic silver compound in the form of a solution, which is produced by dissolving a compound containing a high-conductive metal such as silver in an organic solvent. Here, the organic solvent used in dissolving the silver ink may include a polar solvent such as alcohol, or a non-polar solvent such as toluene or xylene according to composition of a metallic compound. In this embodiment, the conductive ink 50 is not limited to the component of the compound and the composition of the ink as long as it is a metallic compound.

Further, as a hybrid type, there may be used the conductive ink 50 produced by adding silver, copper or the like metal particles to a solution in which the metallic compound is dissolved.

In the step S50 of annealing, organic silver ink is heated at a temperature ranging from 150° C. to 350° C. for a time optimized corresponding to the temperature, thereby abstracting silver particles of a metal state from the organic silver compound.

If the stage (e) of FIG. 2 undergoes the annealing S50, the regions of the mask template 40 corresponding to the recess 42 and the high molecular substance 21 are transformed differently from each other.

In the region corresponding to the recess 42, the metal particles are abstracted from the organic silver ink applied onto the substrate 10 and filled in the recess 42, and then the abstracted metal particles cohere with each other (nano-cluster) and form a conductive network, thereby having electric conductivity. Thus, the metal particles are arranged in the region corresponding to the recess 42 and abstracted from the conductive ink 50, thereby forming a conductive pattern 61.

In the region corresponding to the high molecular substance 21, polyaniline and the organic silver ink, deposited on the high molecular substance 21, are transformed.

Referring to FIG. 3, after the step S50 of the annealing, emeraldine base polyaniline is completely oxidized and transformed into pernigraniline base polyaniline. Such oxidation may be promoted by a functional group of the organic metallic compound. Since pernigraniline base polyaniline has so high specific resistance that it does not have electric conductivity and changes in color from green to dark blue or black.

The organic silver ink applied onto polyaniline infiltrates into pernigraniline base polyaniline, and the metal particles abstracted from the organic silver ink by the annealing are arranged between spaces of polyaniline and spaced apart from each other, so that the conductive network cannot be formed. Thus, an insulating pattern 62 is formed showing general electric insulation instead of electric conductivity that appears only when the metal particles cohere with each other.

Referring to FIGS. 4 and 5, the conductive ink 50 deposited on the high molecular substance 20 infiltrates into the gaps of the high molecular substances 21 the surface of which is modified by the hydrophobic material 30, and is then annealed so that the metal particles 63 can be abstracted therefrom. Thus, the metal particles 63 are spaced apart from each other by the high molecular substance 21 without forming the conductive network. On the other hand, the metal particles 63 deposited on the substrate 10 cohere with each other and form the conductive network.

The foregoing phenomenon can be ascertained by measuring each sheet resistance of the conductive pattern and the insulating pattern. Referring to FIG. 6, it was measured after the annealing at a temperature of 210° C. for 20 minutes that the conductive pattern had a sheet resistance of $2.57 \pm 0.06 \Omega/\square$ and the insulating pattern has a sheet resistance more than $6.01 \pm 1.46 M\Omega/\square$.

As apparent from the foregoing descriptions, there is provided a method for fabricating fine conductive patterns using a surface modified mask template, in which a hydrophobic material is applied onto a high molecular substance that will form a mask template, so that conductive ink to be formed on a substrate and become the conductive pattern can be sufficiently formed in a recess and it can be controlled that the conductive ink infiltrates into the high molecular substance, thereby maintaining a constant amount of the conductive ink that will form the conductive pattern uniform, decreasing the resistance of the conductive pattern, and keeping the thickness of the pattern uniform.

Further, according to an exemplary embodiment of the present invention, there is provided a method for fabricating fine conductive patterns using a surface modified mask template, in which conductive ink is applied to a mask template, so that the conductive ink deposited on a high molecular substance can react with the high molecular substance and form an insulating pattern, but the conductive ink deposited in a recess can form the conductive pattern, thereby having an effect on preventing a short-circuit even though the conductive ink is improperly applied between the adjacent conductive patterns.

In the foregoing embodiments, a laser is employed for partially removing the high molecular substance so as to form the mask template, but not limited thereto. Alternatively, an imprinting method that applies pressure and heat after depositing the high molecular substance onto the substrate may be used for forming the mask template.

In the above described embodiments, the organic silver ink is used as the conductive ink, but not limited thereto. Alternatively, various metallic compounds containing gold, zinc, platinum, nickel, copper or etc. may be used as the conductive ink according to the kinds of fine patterns. Furthermore, various applications to the conductive ink are allowed as long as they are matched with the present invention.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:
1. A method for fabricating fine conductive patterns using a surface modified mask template, the method comprising:
   depositing a polyaniline on a substrate;
   applying a hydrophobic material onto the polyaniline so that the hydrophobic material can infiltrate into the polyaniline;
   forming a mask template by removing a part of the polyaniline to form a recess where a region of the substrate is exposed to an outside;
   depositing conductive ink on the mask template and into the recess; and
   performing annealing to abstract metal particles from a metallic compound dissolved in the conductive ink so that an insulating pattern can be formed in a region on which the polyaniline is deposited, but a conductive pattern can be formed as the metal particles are abstracted from the conductive ink in the recess and cohere with each other.

2. The method according to claim 1, wherein the conductive ink deposited on the polyaniline is infiltrated into gaps of the polyaniline, and the metal particles abstracted from the conductive ink by the annealing are spaced apart and electrically insulated from each other in the polyaniline to form the insulating pattern.

3. The method according to claim 1, wherein the depositing the conductive ink comprises using inkjet printing to deposit the conductive ink.

4. The method according to claim 1, wherein the forming the mask template comprises irradiating a laser beam to the polyaniline to remove the part of the polyaniline.

5. The method according to claim 1, wherein the forming the mask template comprises using an imprinting method.

6. The method according to claim 1, wherein the performing the annealing comprising heating the conductive ink at a temperature ranging from 150° C. to 350° C.

7. The method according to claim 1, wherein the conductive ink comprises an organic metal compound in the form of a solution.

8. The method according to claim 7, wherein the conductive ink further comprises metal particles.

* * * * *